United States Patent
Vieluf

(10) Patent No.: US 11,247,225 B2
(45) Date of Patent: Feb. 15, 2022

(54) SOLID PARTICLE SOURCE, TREATMENT SYSTEM AND METHOD

(71) Applicant: VON ARDENNE Asset GmbH & Co. KG, Dresden (DE)

(72) Inventor: Maik Vieluf, Moritzburg (DE)

(73) Assignee: VON ARDENNE ASSET GMBH & CO. KG, Dresden (DE)

( * ) Notice: Subject to any disclaimer, the term of this patent is extended or adjusted under 35 U.S.C. 154(b) by 191 days.

(21) Appl. No.: 16/603,838

(22) PCT Filed: Apr. 25, 2018

(86) PCT No.: PCT/EP2018/060592
§ 371 (c)(1),
(2) Date: Oct. 9, 2019

(87) PCT Pub. No.: WO2018/197560
PCT Pub. Date: Nov. 1, 2018

(65) Prior Publication Data
US 2020/0114392 A1 Apr. 16, 2020

(30) Foreign Application Priority Data
Apr. 28, 2017 (DE) ...................... 10 2017 109 249.8

(51) Int. Cl.
*C23C 14/30* (2006.01)
*B05D 1/06* (2006.01)
(Continued)

(52) U.S. Cl.
CPC ............. *B05D 1/06* (2013.01); *B05D 3/0493* (2013.01); *C23C 14/02* (2013.01); *C23C 14/30* (2013.01); *B05D 2401/32* (2013.01)

(58) Field of Classification Search
CPC ......... C23C 14/32; C23C 14/30; C23C 14/24; C23C 14/243; C23C 14/325
See application file for complete search history.

(56) References Cited

U.S. PATENT DOCUMENTS 3,575,132 A * 4/1971 Francisco ............... C23C 14/24
118/727
4,777,062 A * 10/1988 Feuerstein ............. C23C 14/32
204/298.05
(Continued)

FOREIGN PATENT DOCUMENTS

DE 19935053 A1 1/2000
DE 102015116351 A1 3/2017

OTHER PUBLICATIONS

International Search Report based on application No. PCT/EP2018/060592 (7 pages) dated Sep. 27, 2018 (for reference purpose only).
(Continued)

*Primary Examiner* — Jaehwan Oh
(74) *Attorney, Agent, or Firm* — Viering, Jentschura & Partner mbB

(57) ABSTRACT

The invention relates to various embodiments of a solid particle-source (100a, 100a) that can comprise: a container (104) which comprises an area for receiving solid particles; at least one electron source (106) for introducing electrons into the solid particles such that an electrostatic charge of the solid particles produced by the electrons separates them from each other and accelerates them in a direction out from the container (104); a vibration source (110) which is designed to introduce a vibration in the region in order to loosen the solid particles, the electronic source comprising an emission surface for emitting electrons into a vacuum emission region.

11 Claims, 8 Drawing Sheets

Figure 1A:
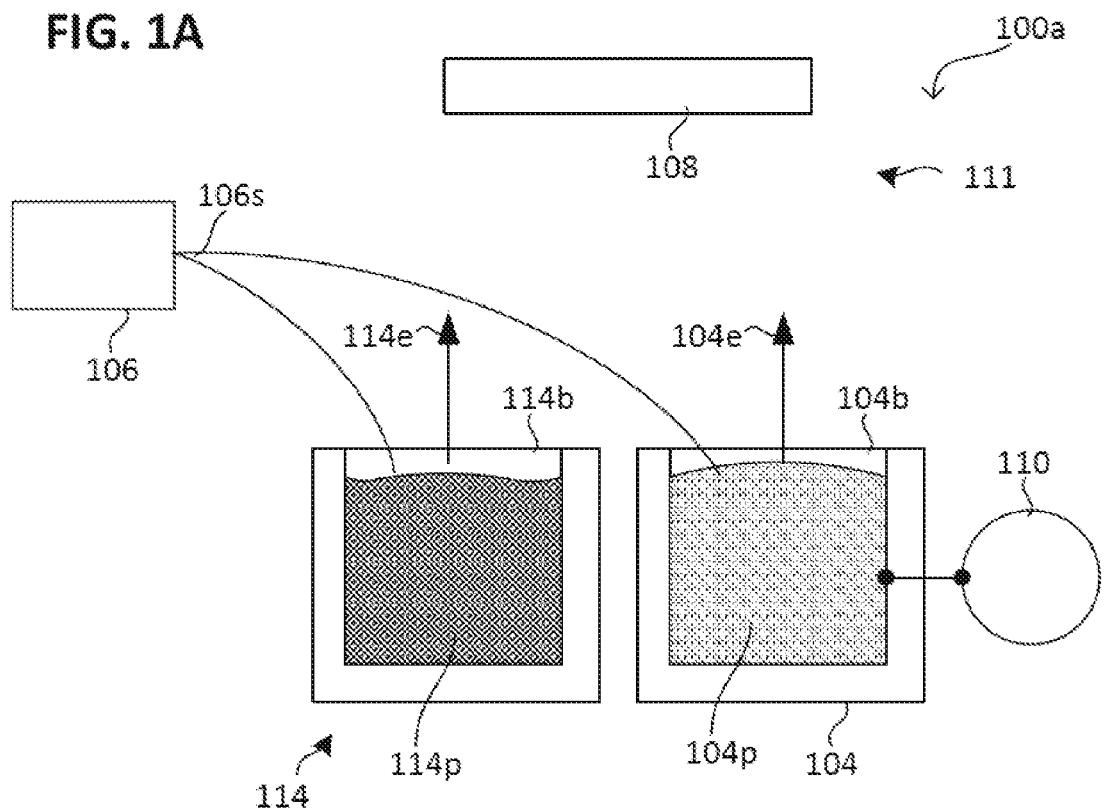

(51) Int. Cl.
*B05D 3/04* (2006.01)
*C23C 14/02* (2006.01)

(56) References Cited

U.S. PATENT DOCUMENTS

| | | | |
|---|---|---|---|
| 6,280,802 B1 | 8/2001 | Akedo et al. | |
| 2002/0104483 A1* | 8/2002 | Misiano | C23C 14/32 118/726 |
| 2004/0168635 A1* | 9/2004 | Neumann | H01J 37/32422 118/723 R |
| 2005/0011443 A1* | 1/2005 | Matsukaze | H01L 51/0008 118/715 |
| 2011/0268893 A1* | 11/2011 | Honda | C23C 14/246 427/596 |
| 2015/0315696 A1* | 11/2015 | Stuber | B08B 3/10 420/507 |
| 2018/0309136 A1 | 10/2018 | Vieluf et al. | |

OTHER PUBLICATIONS

German Search Report based on application No. 10 2017 109 249.8 (8 pages) dated Nov. 24, 2017 (for reference purpose only).

* cited by examiner

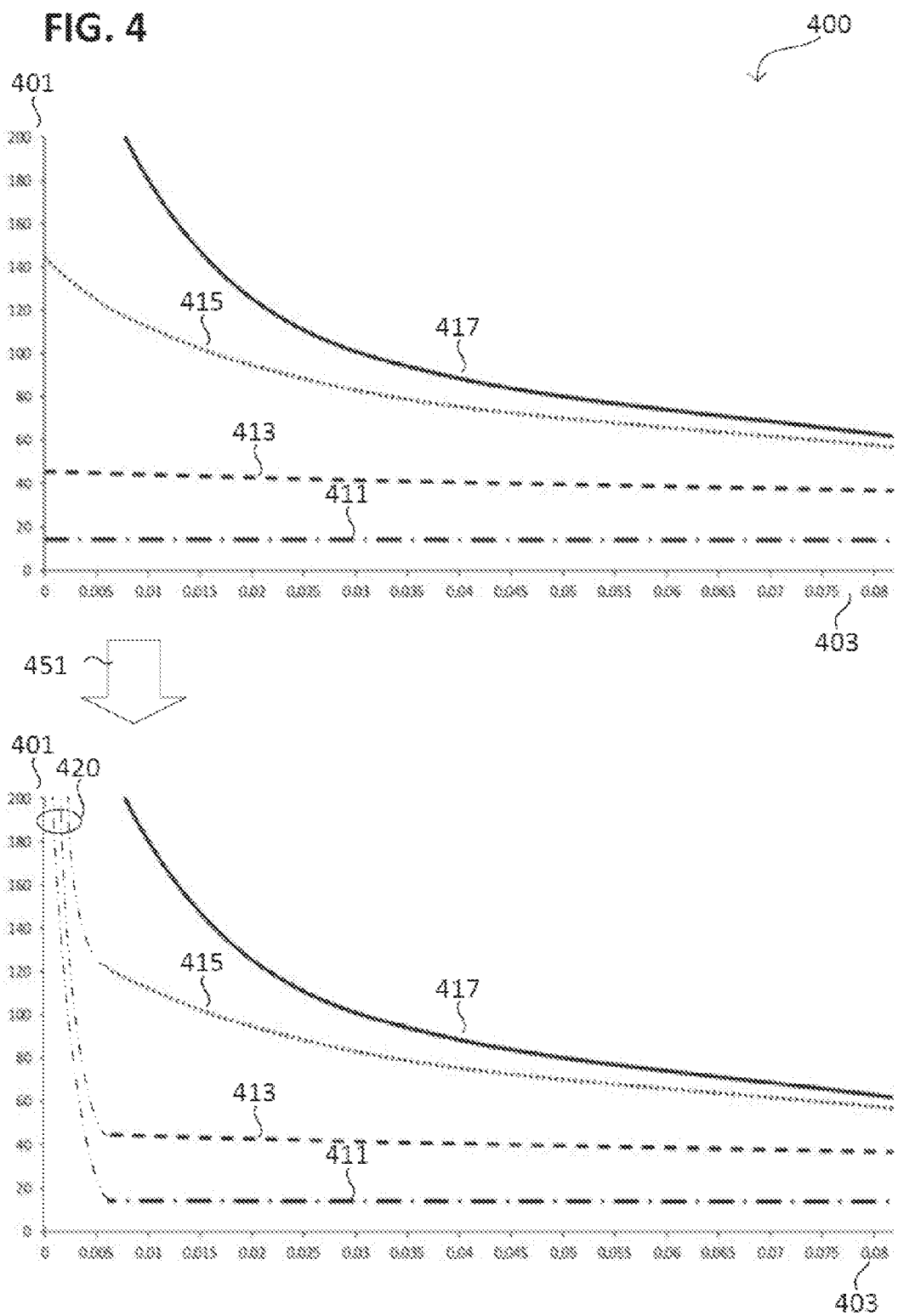

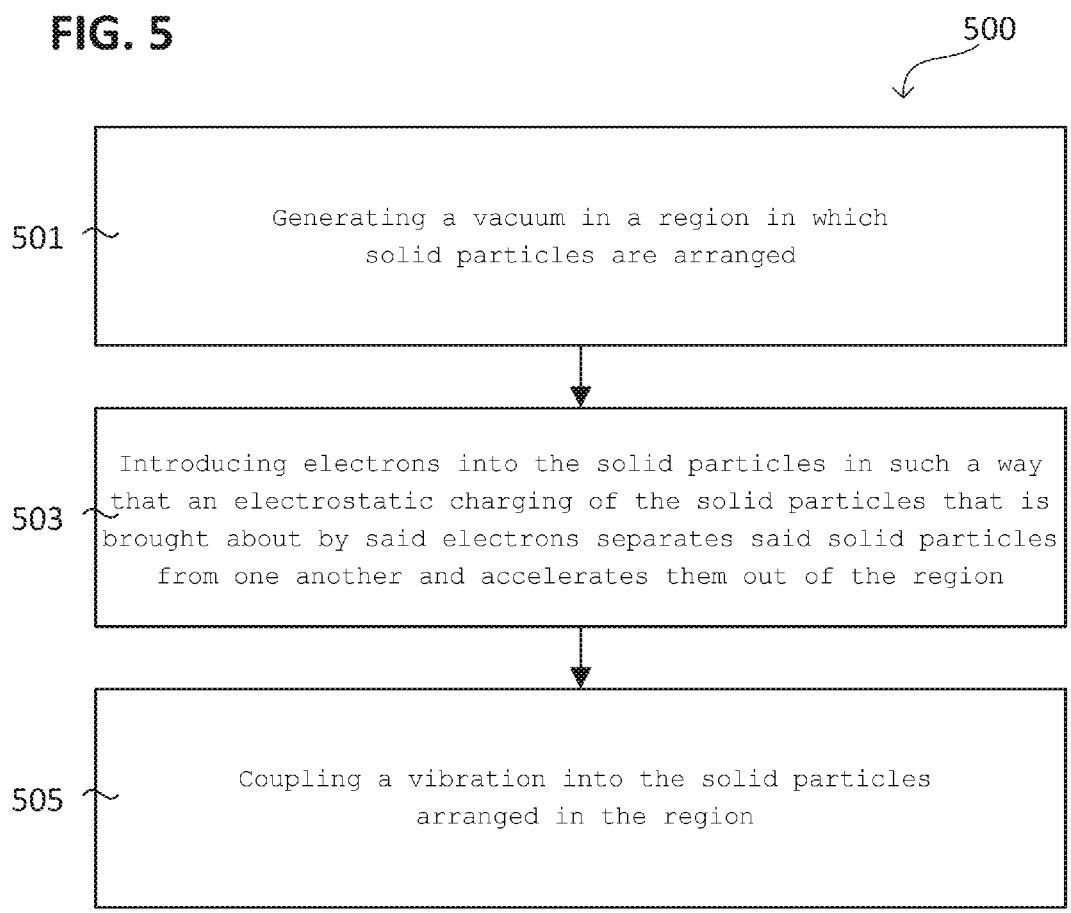

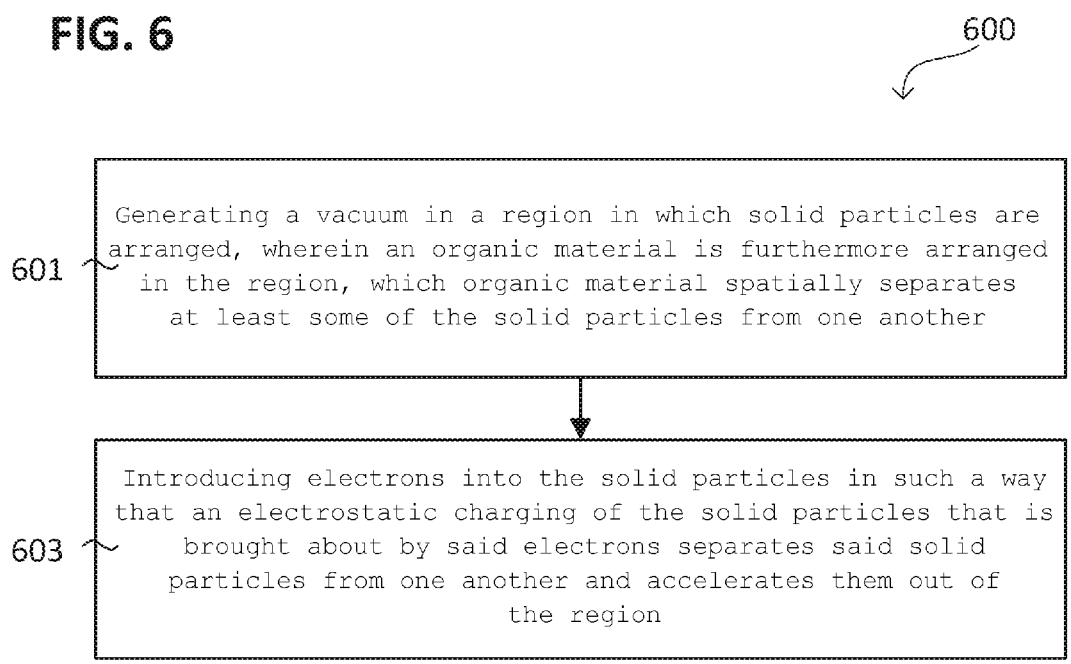

SOLID PARTICLE SOURCE, TREATMENT SYSTEM AND METHOD

CROSS-REFERENCE TO RELATED APPLICATIONS

This is a U.S. national phase application arising out of PCT Application PCT/EP2018/060592, which was filed on Apr. 25, 2018, and which claims priority to German Application 10 2017 109 249.8, which was filed on Apr. 28, 2017, the contents of each of which are incorporated fully herein by reference.

The invention relates to a solid particle source, to a treatment system and to a method.

In general, surfaces may be coated in order to functionalize them, e.g. in order to alter their physical and/or chemical properties. In the field of batteries, illustratively layers composed of active materials may be used in order to ensure high capacities or a high intercalation ability of ions. By way of example, the electrodes in lithium-ion batteries are coated with the active material, which has the highest possible active surface area for a predefined layer thickness in order to promote the intercalation of lithium ions. In the field of fuel cells, gas diffusion layers (GDLs) and/or bipolar plates may be coated in order to increase their electrical conductivity and/or their water-repellency.

In general, solid particles may be used in order to functionalize surfaces or to be functionalized themselves. By way of example, surface protection that increases e.g. the wear resistance or chemical resistance may be achieved by means of solid particles. Alternatively, a surface activation that increases the active surface area and/or the chemical reactivity may be achieved by means of the solid particles. By way of example, porous layers may be produced by means of the solid particles.

For applying the solid particles, a surface to be treated or coated, various methods are known depending on the surface area or layer thickness to be obtained. Often the solid particles are wet-chemically or mechanically mixed with a binder, and applied on the surface e.g. by spraying, slot die coating, screen printing or so-called spin-coating and are dried in a subsequent process. The binder-based coating (wet-chemical coating) makes possible a very high throughput with low costs and is therefore particularly economic and suitable for large-scale industrial manufacturing. The processed solid particles may themselves consist of the functional material or themselves be the carrier thereof (i.e. said solid particles may be coated with the functional material). By way of example, the solid particles themselves may likewise be functionalized by means of a coating in order e.g. to alter their physical and/or chemical properties. Alternatively or additionally, it may be necessary to coat the functional material itself, e.g. in order to chemically passivate the latter. The coating of the solid particles themselves should be carried out before the wet-chemical coating.

In comparison with the wet-chemical coating, however, the conventionally used methods for coating the solid particles have a distinctly low throughput with higher costs. Furthermore, additional measures are needed in order to prevent the solid particles from adhesively bonding to one another and forming clusters during the process of coating said solid particles, which clusters may no longer be processed and therefore contaminate the solid particle material. By way of example, for coating the solid particles, use is conventionally made of so-called cathode sputtering, a rebound vibration device or a tumbling fluidized bed granulator coating, which are time-consuming, in particular. In order to compensate for this low throughput, a large number of coating apparatuses have to be kept available, which increase floor space, procurement costs, maintenance and personnel costs.

Therefore the coating of or with solid particles constitutes a major cost factor which may exceed the limits of economic viability in large-scale industrial manufacturing. By way of example, in large-scale manufacturing, hundreds of kilograms of solid particles are consumed per manufacturing apparatus, and their coating itself may in turn require a plurality of manufacturing apparatuses.

DE 10 2015 116 351 A1 describes, for example, a method and a device for emitting solid particles into a vacuum.

In accordance with various embodiments, a method, a treatment system and a solid particle source are provided which illustratively provide a higher throughput during the coating of and/or with solid particles.

Illustratively, electron-beam-based emission of the solid particles in a vacuum is provided, which, in comparison with conventional methods, increases the throughput and reduces the costs—and moreover permits new material combinations. Illustratively, an electron beam gun cost-effectively provides a high electrical power which makes it possible both to emit large amount of solid particles into a vacuum and optionally to generate a large amount of material vapor for coating/functionalizing and/or binding them.

With the solid particles, by way of example, a surface to be functionalized may be coated in the vacuum. Alternatively or additionally, the solid particles may be coated in the vacuum. Moreover, after the solid particles have been coated, they may be applied in a conventional manner, e.g. by means of a wet-chemical coating method, on a surface to be functionalized.

In accordance with various embodiments, it has been recognized that the electron-beam-based emission of solid particles (also referred to as solid particle emission) is subject to a multiplicity of influencing factors, the complex interplay of which makes it more difficult, for example, to predict, to reproduce and/or to keep constant over time the emission rate (e.g. emitted solid particles/time or emitted mass of the solid particles/time).

Illustratively, it has been recognized that the emission rate for a predefined power of the electrons introduced is dependent not only on the constitution of the solid particles themselves, such as, for example, their size, their chemical composition, their electrical resistance and/or their shape, but also on their storage, e.g. their compression, their particle density, their bed height, etc., and/or else on their feeding. By way of example the emission rate may be affected if the solid particles are compressed (also referred to as densified) to a higher particle density and/or if the particle density has a gradient. This multiplicity of influencing variables may intermesh to form a complex interplay, the result of which yields the emission rate and/or the temporal dependence thereof.

It is conventional practice to accept the effects on the emission rate since the constitution and/or storage of the solid particles may be altered only with difficulty or may no longer be altered at all after the beginning of the solid particle emission. However, this increases the difficulty of industrializing coating with solid particles (also referred to as FPD—"fast particle deposition") and coating of solid particles (also referred to as FPC—"fast particle coating"), since reproducible coating processes, on account of the influencing variables, firstly become very complex and in the case of specific materials, secondly become simply impossible.

It has been recognized in that context that the complex interplay of the multiplicity of influencing variables may be simplified by considering the effect thereof on the electrical solid particle-to-solid particle resistance. In other words, it has been recognized that the electrical solid particle-to-solid particle resistance functions as a link between the emission rate and the multiplicity of influencing variables.

The solid particle-to-solid particle resistance decreases for example as the particle density rises if the solid particles clump together, as the electrical conductivity of the solid particles decreases if they are inert or the like. By way of example, a spatial gradient in the particle density, which results for example on account of the solid particles' own weight force, i.e. illustratively on account of a self-compression of the solid particles with increasing filling of the particle container, may lead to a temporal gradient in the emission rate. The emission rate may therefore decrease over the course of time while the particle container is being emptied.

This property as a link is utilized, in accordance with various embodiments, in order to set or at least increase the emission rate of solid particles in a targeted manner. Illustratively, a high solid particle-to-solid particle resistance inhibits the delocalization of the electrical charges introduced and thus increases the resultant emission rate of solid particles.

In accordance with various embodiments, the solid particle-to-solid particle resistance is set or at least increased in a targeted manner by the solid particles being loosened by means of a collective vibration.

Illustratively, a method, a treatment system, and a solid particle source are provided which loosen the solid particles in order, for example, to provide a temporally constant and/or reproducible emission rate.

In accordance with various embodiments, a solid particle source may include: a container (also referred to as particle container) including a region for receiving solid particles; at least one electron source (e.g. electron beam source) for introducing electrons into the solid particles (e.g. by means of an electron beam) in such a way that an electrostatic charging of the solid particles that is brought about by said electrons separates said solid particles from one another and accelerates them in a direction out of the container; a vibration source (also referred to as exciter) configured to couple a vibration into the region (e.g. to transmit said vibration into said region) for loosening the solid particles. The electron source may for example include an emission surface for emitting electrons into a vacuum region or be configured in some other way for emitting electrons (also referred to as electron emission) into an emission region.

Electron emission may be understood to mean the process in which electrons are emitted and/or emanate from a solid material (also referred to as solid), e.g. into a vacuum (e.g. a high vacuum) and/or out of its surface (also referred to as emission surface). Electrons may be liberated from the solid (e.g. the electron shells thereof) for example as secondary electrons or as a result of high electric field strengths (also referred to as field emission) or high temperatures (also referred to as thermal emission, e.g. by means of the Edison-Richardson effect). This last may take place by means of a thermionic cathode. Secondary electrons arise for example as a result of the external photoelectric effect or as a result of the impact of particles, in particular ions (for example in the corona discharge of cold cathode lamps) or of other electrons (also referred to as primary electrons). The electron emission may be configured for the contact-free transfer of the electrons into the solid particles and/or the container.

In accordance with various embodiments, the electron source may be a contactless electron source. In other words, the electron source may be configured to introduce the electrons contactlessly (i.e. without a solid-solid contact) into the solid particles and/or the container. By way of example, introducing the electrons may include providing a free trajectory for the electrons.

Coupling in the vibration may include transmitting a mechanical vibration into the region and/or generating said mechanical vibration therein.

In accordance with various embodiments, the vibration source may include an electromechanical transducer.

The electromechanical transducer may be configured to convert an electrical signal (e.g. an oscillation and/or a voltage) into a (for example corresponding) mechanical vibration, e.g. by means of a piezeoelectric, inductive and/or unbalance conversion.

In accordance with various embodiments, the vibration source may include an electrical coil.

In accordance with various embodiments, the vibration source may include a membrane adjoining the region.

In accordance with various embodiments, the vibration source may be configured to transmit an electromagnetic vibration generated outside the region into the container (e.g. to couple an electromagnetic wave into the region).

In accordance with various embodiments, the vibration source may be configured to transmit a mechanical vibration generated outside the region into the container and/or onto the container.

In accordance with various embodiments, a treatment system may include the following: a solid particle source in accordance with various embodiments, and a collecting device for collecting solid particles which are accelerated out of the region (and are optionally coated with a coating material).

In accordance with various embodiments, a treatment system may furthermore include the following: a coating region, which is arranged between the collecting device and the solid particle source (e.g. with respect to the container in the direction) or in which the collecting device is arranged; a material vapor source configured to emit a material vapor into the coating region (e.g. toward the collecting device and/or past the latter).

In accordance with various embodiments, the collecting device may include a substrate holder for holding a substrate to be coated with a substrate surface of the substrate in the direction of the region. The substrate holder may be for example part of a substrate transport device.

In accordance with various embodiments, the collecting device may include an additional container and be configured to collect solid particles by means of the additional container and/or to transport them into the latter (e.g. by means of a solid particle transport device).

In accordance with various embodiments, the treatment system may furthermore include: a vacuum chamber, in which the region, the collecting device and/or the coating region are/is arranged.

In accordance with various embodiments, a method may include the following: generating a vacuum in a region in which solid particles are arranged; introducing electrons into the solid particles (e.g. by means of an electron beam), in such a way that an electrostatic charging of the solid particles that is brought about by said electrons separates said solid particles from one another and accelerates them out of the region; and coupling a vibration into the solid particles arranged in the region (e.g. during the process of introducing the electrons into the solid particles). The method (e.g. the introducing) may e.g. furthermore include: emitting electrons into the vacuum, wherein at least one portion of the electrons is introduced into the solid particles.

In accordance with various embodiments, a method may include the following: generating a vacuum in a region in which (e.g. inorganic) solid particles are arranged, wherein an organic material is furthermore arranged in the region, which organic material spatially separates at least some of the solid particles from one another; introducing electrons into the solid particles (e.g. by means of an electron beam) in such a way that an electrostatic charging of the solid particles that is brought about by said electrons separates said solid particles from one another and accelerates them out of the region. The method (e.g. the introducing) may e.g. furthermore include: emitting electrons into the vacuum, wherein at least one portion of the electrons is introduced into the solid particles.

The organic material may have for example a lower electrical conductivity (corresponds to the reciprocal of the resistivity) than the solid particles. Alternatively or additionally, the solid particles may include a different material than the organic material.

In accordance with various embodiments, the solid particles and the organic material may differ in their chemical composition and/or their material type (e.g. organic/inorganic, metallic/nonmetallic, etc.).

The organic material may for example be provided in the form of (e.g. organic) solid particles and/or at least partly envelop at least some of the solid particles. By way of example, the solid particles may be mixed and/or smeared with the organic material.

In accordance with various embodiments, a method may include the following: generating a vacuum in a region in which solid particles of a first material type and of a second material type are arranged, wherein the solid particles of the first material type have a greater proportion by mass of organic material and/or a lower electrical conductivity than the solid particles of the second type; introducing electrons into the solid particles (e.g. by means of an electron beam) in such a way that an electrostatic charging of the solid particles that is brought about by said electrons separates said solid particles from one another and accelerates them out of the region. The method (e.g. the introducing) may e.g. furthermore include: emitting electrons into the vacuum, wherein at least one portion of the electrons is introduced into the solid particles.

In accordance with various embodiments, a method may include the following: generating a vacuum in a region in which solid particles are arranged, at least some solid particles of which have different material types, at least one material type of which is organic; introducing electrons into the solid particles (e.g. by means of an electron beam) in such a way that an electrostatic charging of the solid particles that is brought about by said electrons separates said solid particles from one another and accelerates them out of the region. The method (e.g. the introducing) may e.g. furthermore include: emitting electrons into the vacuum, wherein at least one portion of the electrons is introduced into the solid particles.

In accordance with various embodiments, the organic material may at least partly envelop at least some of the solid particles.

In accordance with various embodiments, the electron source may include a control that controls the process of introducing electrons into the solid particles.

The electron source may be configured, for example, to keep a temperature of the solid particles during the process of introducing the electrons and/or during the coating process lower than a state of matter transition temperature (e.g. a vaporization temperature, a melting point and/or a sublimation temperature) of the solid particles and/or of the organic material. Illustratively, it is thus possible to prevent the organic material and/or the solid particles from melting, sublimating, sintering together or vaporizing. Illustratively, by means of the process introducing the electrons, the solid particles may be electrostatically charged without their temperature being brought above the state of matter transition temperature. The thermal power loss may be dependent on the temperature of the solid particles and be defined e.g. at their melting point or sublimation temperature.

The electron source may be configured, for example, additionally to cool the solid particles. Alternatively or additionally, a power of the electrons (e.g. electrical and/or kinetic power), i.e. a power input by the electrons, may be configured in such a way that the temperature of the solid particles during the process of introducing the electrons and/or during the coating process is lower than their state of matter transition temperature. By way of example, the power input by means of the electrons may be lower than a thermal power loss of the solid particles.

In the context of this description, the solid particles may understood as particles (illustratively grains) which include or are formed from a solid substance, i.e. matter present in a solid state of matter (wherein the matter may include a plurality of atoms and/or molecules). The solid particles may have an extent (illustratively particle size) and/or average spacing (also referred to as particle spacing) of greater than 5 nm (nanometers), e.g. greater than 0.1 μm (micrometer), e.g. less than 1 mm, e.g. less than 500 μm, e.g. in a range of approximately 10 nm to approximately 500 μm, e.g. in a range of approximately 100 nm to approximately 100 μm, e.g. in a range of approximately 200 nm to approximately 10 μm, or in a range of approximately 0.1 μm to approximately 1 mm, e.g. in a range of approximately 1 μm to approximately 500 μm, e.g. in a range of approximately 10 μm to approximately 250 μm. The assemblage of solid particles may illustratively form granules or a powder (more generally a particle assemblage or particle supply). The extent of the solid particles and/or their spacing from one another may be their averaged extent and/or averaged spacing, e.g. averaged over all solid particles of the particle supply. The average extent of a solid particle may illustratively correspond to a diameter of a sphere having the volume of the solid particle. The average spacing of the solid particles may illustratively correspond to the averaged spacing with respect to the closest (adjacent) solid particles.

In accordance with various embodiments, the solid particles may be arranged in a container including an at least partly electrically conductive container wall, wherein electrons are introduced into the solid particles indirectly via the container wall. In other words, electrons may be introduced into the solid particles from the container wall. What may thus be achieved, for example, is that the electrons are distributed by means of the container wall, which reduces an electric current density brought about by the process of introducing electrons into the solid particles. Consequently, illustratively, it is possible to reduce and/or prevent local heating of the solid particles, e.g. resultant local melting or sintering together. Alternatively, the container may be electrically insulating and/or electrons may be introduced by means of an electron beam directed onto the solid particles.

In accordance with various embodiments, the method may furthermore include: carrying away electrons from the solid particles during the process of introducing electrons into the solid particles, wherein the carrying away is carried out under open-loop or closed-loop control, e.g. by means of an open-loop control. An electrical potential of the solid particles that is brought about by electrons being introduced may thus be controlled by open-loop or closed-loop control. Illustratively, part of the electrical charge introduced as a result of the process of introducing electrons into the solid particles may be carried away again by means of carrying away electrons.

In accordance with various embodiments, an open-loop control may include a feedforward controlled system and thus illustratively implement a sequential control which converts an input variable into an output variable. However, the controlled system may also be part of a closed-loop control circuit, such that a closed-loop control is implemented. In contrast to the pure feedforward control, the closed-loop control exhibits a continuous influencing of the input variable by the output variable, this being brought about by the closed-loop control circuit (feedback). In accordance with various embodiments, a closed-loop control may be used instead of the open-loop control.

In accordance with various embodiments, the introducing may be carried out under open-loop or closed-loop control, e.g. by means of the control. An electrical potential of the solid particles that is brought about by electrons being introduced may thus be controlled by open-loop or closed-loop control.

Alternatively or additionally, coupling the vibration into the region may be carried out under open-loop or closed-loop control, e.g. by means of the control. The electrical solid particle-to-solid particle resistance of the solid particles and/or the emission rate thereof (e.g. emitted solid particles/time or emitted mass of the solid particles/time) may thus be controlled by open-loop or closed-loop control.

In accordance with various embodiments, the method may furthermore include: controlling an electrical potential difference between the substrate and the solid particles by open-loop and/or closed-loop control (e.g. by means of an open-loop control and/or closed-loop control, respectively).

In accordance with various embodiments, a method may furthermore include: coating a substrate with the (optionally coated) solid particles. The coating may include forming a particle layer. Alternatively or additionally, a or the method may include: collecting and/or transporting the (optionally coated) solid particles into an additional container, which is arranged outside the vacuum or is transported out of the latter.

In accordance with various embodiments, the particle layer (also referred to as layer) may include or be formed from solid particles. Optionally, the particle layer may include the coating material, e.g. in the form of a coating of the solid particles, in the form of a solid particle/substrate connection and/or in the form of a solid particle/solid particle connection.

The layer formed by means of the coating process may have a layer thickness (i.e. an extent transversely with respect to the substrate surface) of greater than approximately 10 nm, e.g. greater than approximately 100 nm, e.g. greater than approximately 1 µm, e.g. greater than approximately 10 µm, e.g. greater than approximately 100 µm, e.g. greater than approximately 1 mm, e.g. greater than approximately 10 mm. Alternatively or additionally, the layer may have a thickness (layer thickness) of less than approximately 1 mm, e.g. less than approximately 100 µm, e.g. less than approximately 10 µm, e.g. less than approximately 1 µm, e.g. less than approximately 500 nm, e.g. less than approximately 250 nm, e.g. less than approximately 100 nm, e.g. less than approximately 50 nm, e.g. less than approximately 25 nm, e.g. less than approximately 10 nm, e.g. less than approximately 5 nm, e.g. in a range of approximately 10 nm to approximately 100 nm or e.g. in a range of approximately 100 nm to approximately 1 µm, or e.g. in a range of approximately 1 µm to approximately 10 µm, or e.g. in a range of approximately 10 µm to approximately 100 µm, or e.g. in a range of approximately 100 µm to approximately 1 mm.

In accordance with various embodiments, the container may be mounted and/or configured in a manner electrically insulated from the vibration source (e.g. in a manner galvanically isolated therefrom). Carrying away of electrons from the container may then be inhibited. Alternatively or additionally, in accordance with various embodiments, the container may be coupled to an electrical reference potential, e.g. to electrical ground, by means of a variable resistor (potentiometer). The control may be configured to regulate and/or to control a resistance value of the potentiometer, e.g. on the basis of coating progress and/or on the basis of a measurement variable representing a layer property.

In accordance with various embodiments, the substrate may be positioned in an electrically insulating manner. Carrying away of electrons from the substrate may then be inhibited. Alternatively, in accordance with various embodiments, the substrate may be coupled to an electrical reference potential, e.g. to electrical ground, by means of a variable resistor (potentiometer). The control may be configured to regulate and/or to control a resistance value of the potentiometer, e.g. on the basis of coating progress and/or on the basis of a measurement variable representing a layer property.

The material vapor (e.g. formed form a coating material, also referred to as vaporization of the coating material) may be emitted in such a way that said material vapor brings about coating of the solid particles and/or of the coating of the substrate.

Coating the solid particles with the coating material may include binding more coating material to the solid particles before the process of collecting the solid particles (by means of the collecting device) than after the process of collecting the solid particles (by means of the collecting device). Coating the substrate with the coating material may include binding more coating material to the solid particles after the process of collecting the solid particles (by means of the substrate) than before the process of collecting the solid particles (by means of the substrate).

Coating the solid particles with the coating material (e.g. in the coating region) may include forming a layer (also referred to as solid particle coating or more simply coating) on at least some of the emitted solid particles. The layer may include or be formed from the coating material. By way of example, the layer may include or be formed from an oxide of the coating material. The layer need not necessarily completely encapsulate a solid particle. By way of example, the layer may partly cover the solid particle, e.g. more than approximately 10% and/or less than approximately 90% (of the surface of the solid particle), e.g. more than approximately 20% and/or less than approximately 80%, e.g. more than approximately 30% and/or less than approximately 70%.

For the purpose of coating the solid particles, a treatment system may include the following: a vacuum chamber having a coating region and a collecting region, in which a collecting device is arranged; a solid particle source configured to emit solid particles with a first main propagation direction through the coating region into the collecting region; a material vapor source configured to vaporize a coating material with a second main propagation direction into the coating region; wherein the first main propagation direction and the second main propagation direction extend at an angle with respect to one another in such a way that the material vapor source vaporizes the coating material past the collecting region and/or the collecting device (e.g. more than into said region and/or toward said device). The collecting device may be or remain free of the material vapor, for example.

For the purpose of coating the solid particles, a method may include the following: generating a vacuum in a coating region and in a collecting region, in which the collecting device is arranged; emitting solid particles with a first main propagation direction through the coating region into the collecting region; vaporizing a coating material (may also be referred to as vaporization material) with a second main propagation direction into the coating region, wherein the first main propagation direction and the second main propagation direction extend at an angle with respect to one another in such a way that the coating material is vaporized past the collecting region and/or the collecting device (e.g. more than into said region and/or toward said device).

For the purpose of coating a substrate (which is held by means of the collecting device, for example) with the coating material, by contrast, the coating material may be vaporized into the collecting region (e.g. more than past said region), in which the substrate is arranged. In other words, the first main propagation direction and the second main propagation direction may extend with respect to one another in such a way that the coating material is vaporized into the collecting region and/or toward the collecting device (e.g. more than past said region and/or past said device).

The coating material with which the substrate is coated may for example include or be formed from a connector material, which differs from the solid particles. The method may furthermore include: forming a solid particle/solid particle connection including or formed from the connector material. The layer may include the solid particles and the solid particle/solid particle connection. The connector material may optionally be configured to react chemically with the solid particles in a gaseous state (e.g. a carbide may be formed, e.g. titanium carbide). Alternatively or additionally, the method may include: forming a substrate/solid particle connection including or formed from the connector material. The layer may include the solid particles and the substrate/solid particle connection. The connector material may be configured to react chemically with the solid particles and/or the substrate in a gaseous state. Alternatively or additionally, the organic material that separates the solid particles in the container from one another may include or be formed from the connector material.

In accordance with various embodiments, the solid particles with which e.g. the substrate is coated and/or the coating material with which e.g. the solid particles are coated may include a rechargeable battery active material, a fuel cell active material, a solar cell active material, a catalyst material and/or a solid electrolyte.

An electrolyte may be understood to mean a material which is dissociated into ions in the solid (solid electrolyte), liquid or dissolved state, such that said ions may move directionally under the influence of an electric field. A rechargeable battery active material may be understood to mean a material which takes up or releases electrical charges under a chemical reaction (in other words which converts electrical energy into chemical energy, and vice versa). A fuel cell active material may be understood for example to mean a material which is applied as a microporous layer (MPL) in the form of a gas diffusion layer on a fabric (mesh, nonwoven). A catalyst material may be understood to mean a material which increases a reaction rate by lowering the activation energy of a chemical reaction, without itself being consumed in the process. A solar cell active material may be understood to mean a material which converts radiation energy (energy of electromagnetic radiation, e.g. light) into electrical energy, and vice versa.

The solid electrolyte may include or be formed from one of the following, for example: yttrium-stabilized zirconium (YSZ), zirconium dioxide ($ZrO_2$), yttrium oxide ($Y_2O_3$), lithium phosphorus oxynitride (LiPON), a sulfidic glass and/or other ionically conductive oxides having a high conductivity, such as, for example, LATP ($Li_aAl_bTi_c(PO_d)_e$) and/or LLZO ($Li_fLa_gZr_hO_i$).

In accordance with various embodiments, the solid particles and/or the coating material may differ from one another in their chemical composition and/or include or be formed from at least one material of the following materials: a metal; a transition metal, an oxide (e.g. a metal oxide or a transition metal oxide); a dielectric; an organic or inorganic polymer (e.g. a carbon-based polymer or a silicon-based polymer); an oxynitride; a nitride; a carbide; a ceramic; a semimetal (e.g. carbon); a perovskite; a glass or vitreous material (e.g. a sulfidic glass); a semiconductor; a semiconductor oxide; a semiorganic material, and/or an organic material.

The carbon may include or be formed from at least one of the following carbon configurations: graphite; amorphous carbon; tetrahedral carbon; diamond-like carbon; fullerenes; diamond; carbon nanotubes; amorphous-tetrahedral carbon; and/or nanocrystalline carbon, e.g. nanocrystalline graphite. Optionally, hydrogen may be taken up in the carbon (i.e. a carbon configuration admixed with hydrogen).

In accordance with various embodiments, the coating material may include or be formed from at least one metal (e.g. nickel, titanium and/or chromium). By way of example, (nonmetallic, e.g. ceramic and/or organic) solid particles may be coated with a metallic coating material, e.g. in order to form a metal coating. By way of example, platinum-coated carbon-containing solid particles (e.g. carbon black particles, carbon particles and/or graphite particles) and/or ruthenium-coated carbon-containing solid particles (e.g. carbon black particles, carbon particles and/or graphite particles) and/or palladium-coated carbon-containing solid particles (e.g. carbon black particles, carbon particles and/or graphite particles) and/or zinc-coated carbon-containing solid particles (e.g. carbon black particles, carbon particles and/or graphite particles) may be provided. In accordance with various embodiments, the coating of the solid particles may be provided by means of the material vapor source (also referred to as covaporization).

The carbon-containing solid particles may include or be formed from carbon in a modification of the carbon (also referred to as carbon modification), for example carbon black (e.g. industrial carbon black), graphite, amorphous carbon, tetrahedral carbon, diamond-like carbon, amorphous-tetrahedral carbon and/or nanocrystalline carbon.

Alternatively, the solid particles may include or be formed from a metal.

In the context of this description, a metal (also referred to as metallic material) may include (or be formed from) at least one metallic element (i.e. one or a plurality of metallic elements), e.g. at least one element from the following group of elements: copper (Cu), iron (Fe), titanium (Ti), nickel (Ni), Silver (Ag), chromium (Cr), platinum (Pt), ruthenium (Ru), gold (Au), magnesium (Mg), aluminum (Al), zirconium (Zr), tantalum (Ta), molybdenum (Mo), tungsten (W), vanadium (V), barium (Ba), indium (In), calcium (Ca), hafnium (Hf), samarium (Sm), silver (Ag), palladium (Pd), zinc (Zn) and/or lithium (Li). Furthermore, a metal may include or be formed from metallic compound (e.g. an intermetallic compound or an alloy), e.g. a compound including at least two metallic elements (e.g. from the group of elements), such as e.g. bronze or brass, or e.g. a compound including at least one metallic element (e.g. from the group of elements) and at least one nonmetallic element (e.g. carbon), such as e.g. steel. Alternatively or additionally, a metal may have a thermal conductivity of greater than 10 W/(m·K), e.g. greater than 50 W/(m·K).

In the context of this description, a plastic may be understood to mean an organic substance in polymer form (e.g. a polymer), e.g. polyamide, polyethylene terephthalate (PET), polytetrafluoroethylene (PTFE), or electrically conductive polymer.

A rechargeable battery active material (e.g. its electrode, e.g. the cathode) may for example include or be formed from nickel manganese cobalt (NMC) (e.g. in a lithium iron phosphate rechargeable battery cell), include or be formed from lithium iron phosphate (LFP) (e.g. in a lithium iron phosphate rechargeable battery cell), include or be formed from lithium manganese oxide (LMO) (e.g. in a lithium manganese oxide rechargeable battery cell) and/or include or be formed from lithium nickel manganese oxide (LNMO) (e.g. in a lithium titanate rechargeable battery cell). For lithium-ion rechargeable batteries, the active material may also be referred to as lithium compound active material.

A rechargeable battery active material (e.g. its counter-electrode, e.g. the anode) may also for example include or be formed from graphite (or carbon in some other configuration), include or be formed from nanocrystalline and/or amorphous silicon, include or be formed from lithium titanate (spinel) oxide ($Li_4Ti_5O_{12}$ or LTO), include or be formed from metallic lithium, or include or be formed from tin dioxide ($SnO_2$).

Optionally, in the field of lithium-ion rechargeable batteries, conventional connector materials in the form of solid particles, for example PEO (polyethylene oxide), PEG (polyethylene glycol), PVDF homopolymer, CMC (carboxymethylcellulose) or HPMC (hydroxypropylmethylcellulose) may be provided with a metal-like and/or carbon-containing functional layer in order to achieve an improved electrical conductivity and/or improved barrier effect. In other words, in accordance with various embodiments, the solid particles may be coated with a metallic and/or a carbon-containing material.

In accordance with various embodiments, the coated solid particles may be introduced into a liquid or pasty carrier and be applied jointly therewith on a substrate (wet-chemical coating), e.g. outside the vacuum or the vacuum chamber, in order to form the particle layer. In other words, the coated solid particles may be processed further outside the vacuum.

In accordance with various embodiments, emitting the solid particles and/or vaporizing the coating material may be carried out by means of exactly one electron beam source (at least exactly one electron beam gun) or by means of a plurality of electron beam sources (e.g. a plurality of electron beam guns).

The or each electron beam source may be configured to provide an electron beam having more than approximately 5 kW (kilowatts), e.g. more than approximately 10 kW, e.g. more than approximately 30 kW, e.g. more than approximately 40 kW, e.g. more than approximately 50 kW.

In accordance with various embodiments, the substrate may include or be formed from an electrode of a rechargeable battery, of a capacitor, of a solar cell or of a fuel cell. Alternatively or additionally, the substrate (e.g. the electrode) may include or be formed from a film or a film structure, a plate or a plate structure.

In accordance with various embodiments, the substrate may include or be formed from a gas diffusion layer of a fuel cell. Alternatively or additionally, the substrate (e.g. the gas diffusion layer) may include or be formed from a gas-permeable structure, for example a fabric including a plurality of filaments or a membrane. The filaments may include or be formed from a polymer and/or a metal. By way of example, the substrate (e.g. the gas diffusion layer) may include or be formed from a metal fabric and/or a polymer fabric.

In accordance with various embodiments, the substrate may include or be formed from an electrolyte (e.g. an electrolyte plate, an electrolyte membrane or an electrolyte film) of a rechargeable battery or of a fuel cell.

In accordance with various embodiments, the substrate may include or be formed from a separator of a rechargeable battery or of a fuel cell (e.g. in the case of a liquid electrolyte cell, such as a direct methanol fuel cell). The separator may be configured to spatially separate and electrically isolate the electrodes of the rechargeable battery or of the fuel cell (i.e. the negative and positive electrodes, e.g. cathode and anode) from one another. The separator may be configured to be ion-transmissive. Consequently, ions which e.g. bring about the conversion of the stored chemical energy into electrical energy, or vice versa, may penetrate through the separator. The separator may be microporous, wherein the separator may include or be formed from a polymer (e.g. a plastic) and/or glass. Alternatively or additionally, the separator may include fibers, e.g. in the form of a nonwoven, e.g. glass fiber or polyethylene fibers.

In accordance with various embodiments, the substrate may include or be formed from an electrode, an electrolyte (e.g. an electrolyte plate, an electrolyte membrane or an electrolyte film) or a gas diffusion layer of a fuel cell. In that case, the solid particles may include a catalyst material, for example. In that case, the catalyst material may be arranged between an electrode (e.g. the anode) of the fuel cell and the electrolyte of the fuel cell.

In accordance with various embodiments, the substrate may include or be formed from a bipolar plate (e.g. an electrode plate, a separator plate) of a fuel cell.

In accordance with various embodiments, a treatment system for coating a substrate may include the following: a particle container including a region for receiving solid particles; a positioning device for positioning a substrate with a substrate surface of the substrate in the direction of the region; at least one electron source for introducing electrons into the solid particles; a control, configured for controlling an electrostatic charging of the solid particles in such a way that a force brought about by the electrostatic charging separates the solid particles from one another and accelerates them in the direction of the substrate surface of the substrate in order to coat the substrate surface with at least one portion of the solid particles separated from one another.

The electron source may include an emission surface (illustratively the surface from which the electrons emanate), which defines the emission region. The emission surface may be the surface of a cathode or of some other solid configured for electron emission. If the electrons are bound in the solid (having the emission surface), detaching them may necessitate overcoming at least the so-called work function. If the electrons are bound in atoms, detaching them may necessitate overcoming at least the so-called electron binding energy. The electron source may be configured to feed to the electrons an energy that is greater than the work function and/or the electron binding energy (e.g. the sum thereof). The work function, by way of the chemical potential, is dependent on the type of solid (substance) from which electrons are detached.

The emission region may for example be arranged between the electron source and the container and/or separate them from one another, e.g. electrically and/or spatially. Alternatively or additionally, the emission region may be free of a solid and/or be a vacuum region. Optionally, the emission region may adjoin the emission surface and/or the container.

Optionally, the emission surface and the container may be galvanically isolated from one another. Optionally, the electron source may be configured to provide a potential difference between the container and the emission surface.

By way of example, the electron source may include or be formed from an electron shower or a beam source. The electron shower may be configured, for example, to provide a nondirectional and/or unfocused electron emission. The beam source may be configured to provide a directional and/or focused electron emission, e.g. in the form of an electron beam.

The electron source may include an emission surface (provided, e.g. by means of a cathode, e.g. by means of a thermionic cathode and/or a field emission cathode) for emitting electrons into an emission region, e.g. in which for example a vacuum is formed. Optionally, the electron source may be part of an electron beam source. The electron beam source may include the electron source and a beam shaping unit. If the beam shaping unit is absent, the electron source may be part of an electron shower.

The beam shaping unit may include at least one electrode or a plurality of electrodes and/or one coil or a plurality of coils. The beam shaping unit may be configured for forming a beam (electron beam) from the electrons emitted into the emission region. The electron beam source may optionally be part of an electron beam gun. The electron beam gun may include the electron beam source and a deflection arrangement. The deflection arrangement may be configured for deflecting the electron beam in accordance with one or a plurality of deflection parameters, e.g. in order to sweep over the region and/or the container, or respectively the further region and/or the further container. The deflection arrangement may include at least one electrode or a plurality of electrodes and/or one coil or a plurality of coils.

The electron shower may include for example a cathode (e.g. a hollow cathode and/or a thermionic cathode), wherein the cathode includes the emission surface. Alternatively or additionally, the electron shower may include a plasma source and/or a corona discharge device.

The collecting device (e.g. the substrate holder) may optionally furthermore be configured for transporting a strip-type substrate (e.g. a film) and/or a plate-type substrate (e.g. a sheet or a plate). For this purpose, the collecting device may include a plurality of transport rollers, for example, by way of which the substrate is moved. The substrate may for example bear on the transport rollers (e.g. in the case of a plate-type substrate) and/or be diverted by means of the transport rollers (e.g. in the case of a strip-type substrate).

In accordance with various embodiments, into a supply of a particulate coating material (which includes the solid particles, also referred to as particles) it may be possible to induce electrons for the electrostatic charging of the solid particles thereby. In this case, the electrostatic charging is effected to an extent such that, for the particles situated in the surface of the supply (also referred to as particle supply or particle assemblage), a Coulomb force is generated which exceeds other forces acting on the particles (e.g. the weight force of the solid particles and/or a force interlinking the latter), such that said particles are emitted in the direction of a collecting device (e.g. holding a substrate) arranged above the particle supply and settle (deposit and/or are taken up) at the collecting device.

In accordance with various embodiments, the particle container may include a heat sink or be thermally coupled to such a heat sink. Illustratively, the solid particles may optionally be actively cooled. The heat sink may be configured for withdrawing thermal energy (also referred to as heat) from the particle container and/or the solid particles, wherein the withdrawing may be controlled e.g. by open-loop and/or closed-loop control, e.g. by means of a control. By means of the heat sink, a heat flow away from the solid particles may be set, e.g. under open-loop and/or closed-loop control by means of the control.

The heat sink may be configured, for example, to transfer the withdrawn thermal energy to a fluid flow (e.g. cooling fluid). The fluid flow may for example include or be formed from a flowing liquid (cooling liquid), i.e. a liquid flow, e.g. oil or water. Alternatively or additionally, the fluid flow may include or be formed from a flowing gas (cooling gas), i.e. a gas flow. The fluid flow may be guided through the particle container for example by means of a fluid conduit. The fluid conduit may include a cavity through which the fluid flow is guided. The fluid flow may optionally be cooled externally relative to the particle container, e.g. by means of a cooling device arranged e.g. outside a vacuum chamber. By way of example, the heat sink may include a heat exchanger including for example a cavity for receiving the fluid flow. Alternatively or additionally, the cooling device may include a heat radiator for cooling the cooling fluid.

In accordance with various embodiments, an electrical surface charge is generated for the particle supply in such a way that the electrostatic Coulomb repulsion between the particles outweighs the other forces acting on the particles, thus resulting in a collective emission of the solid particles (solid particle emission) that proceeds in the vacuum. Under a greatly simplified assumption in which the weight force of the particles predominates, it is possible to proceed on the basis that the Coulomb repulsion constitutes the driving force for the solid particle emission or for the displacement of a particle.

In accordance with various embodiments, the vibration may be coupled into the solid particles, i.e. excite them to vibrate, for example an upper layer of the particle supply.

In accordance with various embodiments, the parameters of the vibration may be controlled by open-loop and/or closed-loop control (e.g. by means of a control), e.g. at least frequency and/or amplitude of the vibration. Illustratively, the vibration may be configured e.g. in a tunable fashion, e.g. by means of an electrical power fed to the vibration source. Alternatively or additionally, the vibration may be controlled by open-loop and/or closed-loop control on the basis of a measurement variable representing the emission rate of the solid particles.

In accordance with various embodiments, the vibration source (e.g. its electrical terminals) may be connected to an electrical power source that feeds the electrical power to the vibration source, e.g. an AC power (e.g. with the frequency and/or amplitude in accordance with the vibration to be coupled in) and/or a DC power (e.g. with a power in accordance with the vibration to the coupled in).

In accordance with various embodiments, the frequency of the vibration may be greater than approximately 0.1 kHz (kilohertz), e.g. greater than approximately 1 kHz, e.g. in a range of approximately 1 kHz (kilohertz) to approximately 1000 kHz, or greater than approximately 10 kHz, e.g. in a range of approximately 10 kHz to approximately 100 kHz. Alternatively or additionally, the vibration coupled in may bring about a vibration of the particle container and/or of the topmost layer of the particle supply of greater than the average particle diameter, e.g. in a range of approximately 0.1 mm (millimeter) to approximately 1 mm.

Exemplary embodiments of the invention are illustrated in the figures and are explained in greater detail below.

In the figures

Figure 1B:
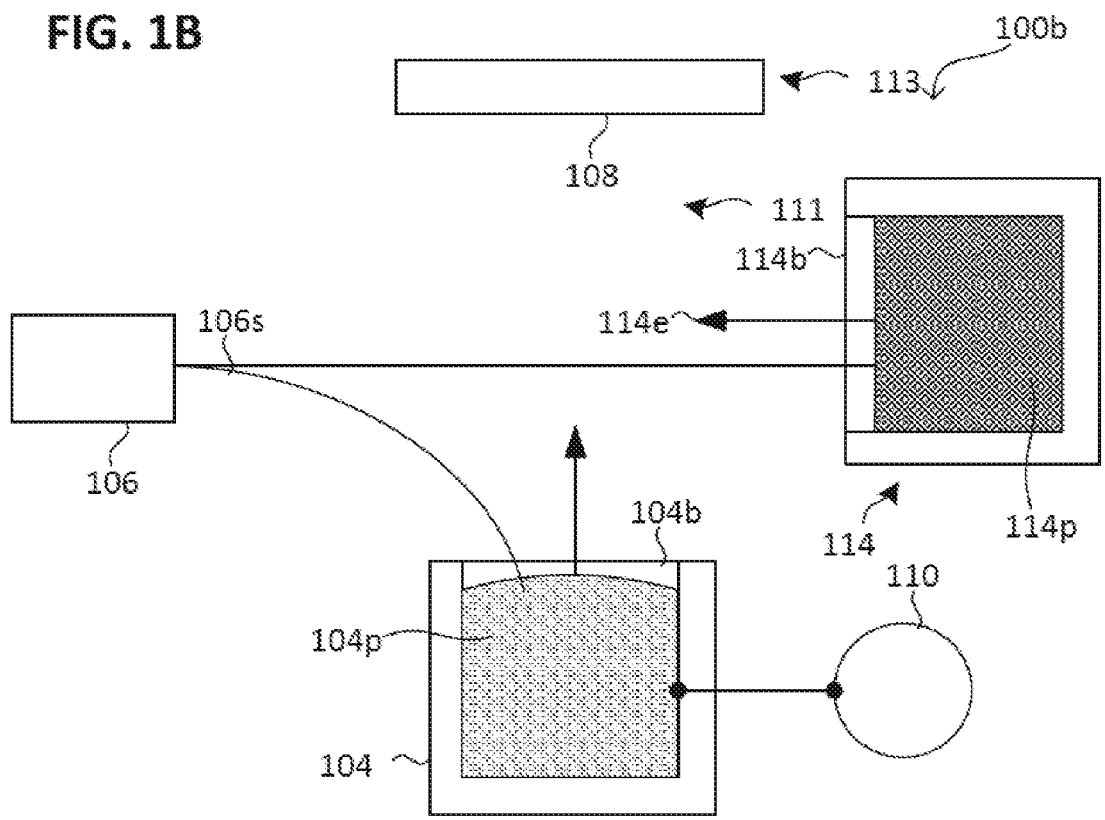
Figure 2A:
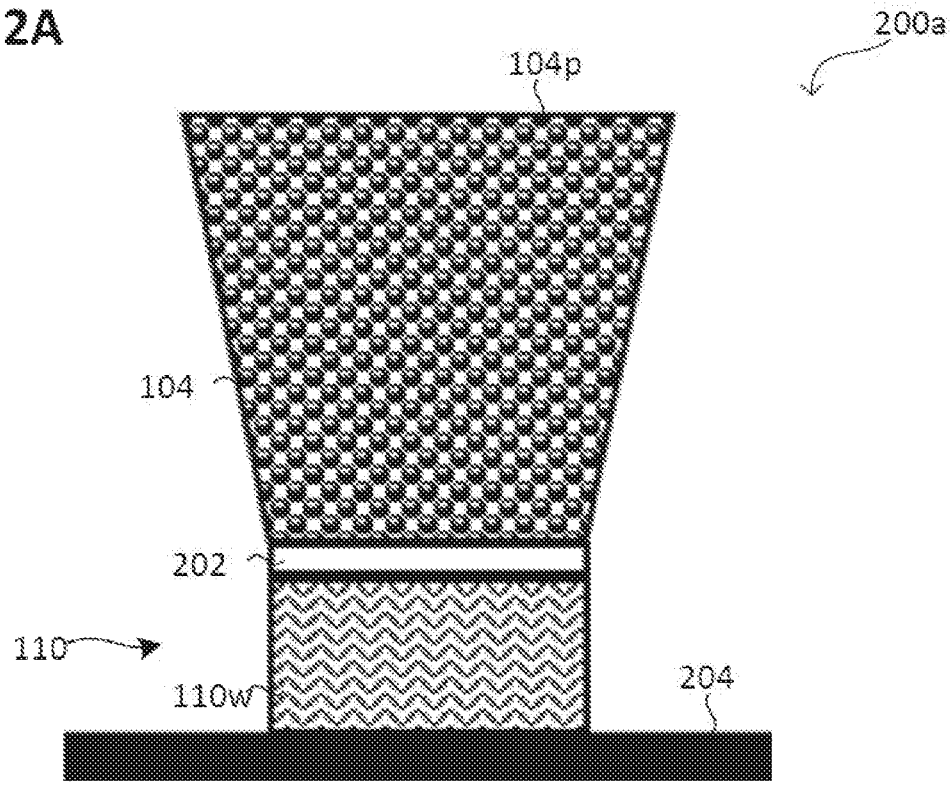
Figure 2B:
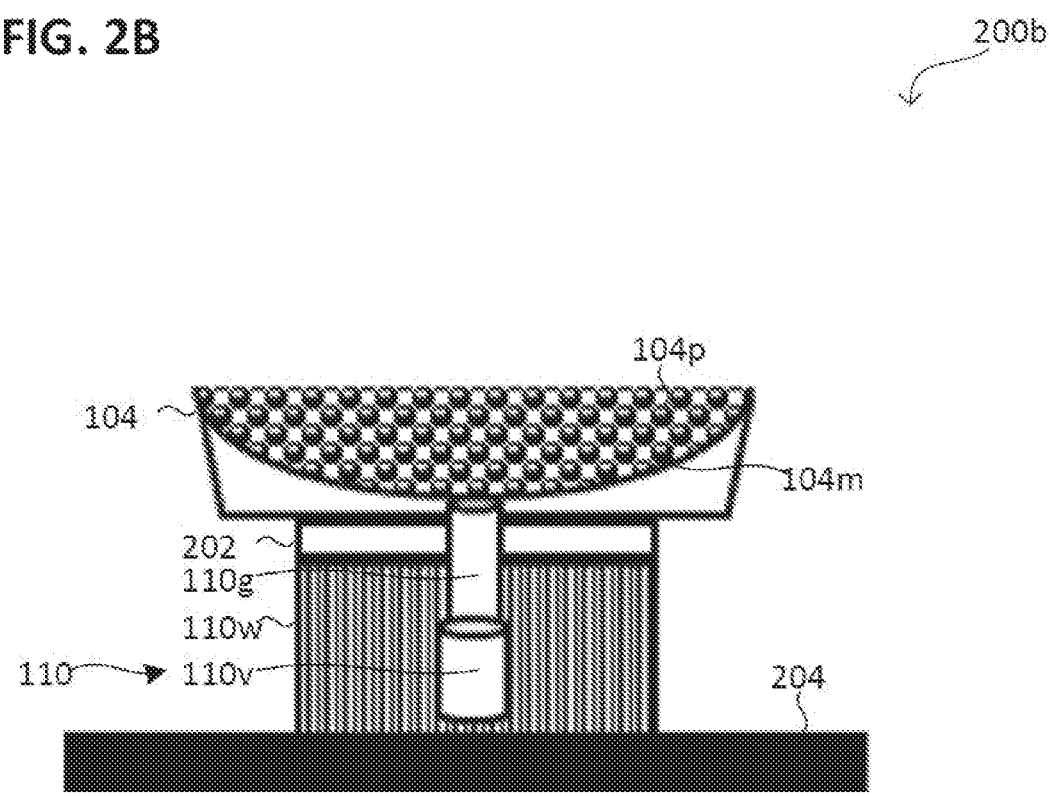
Figure 3A:
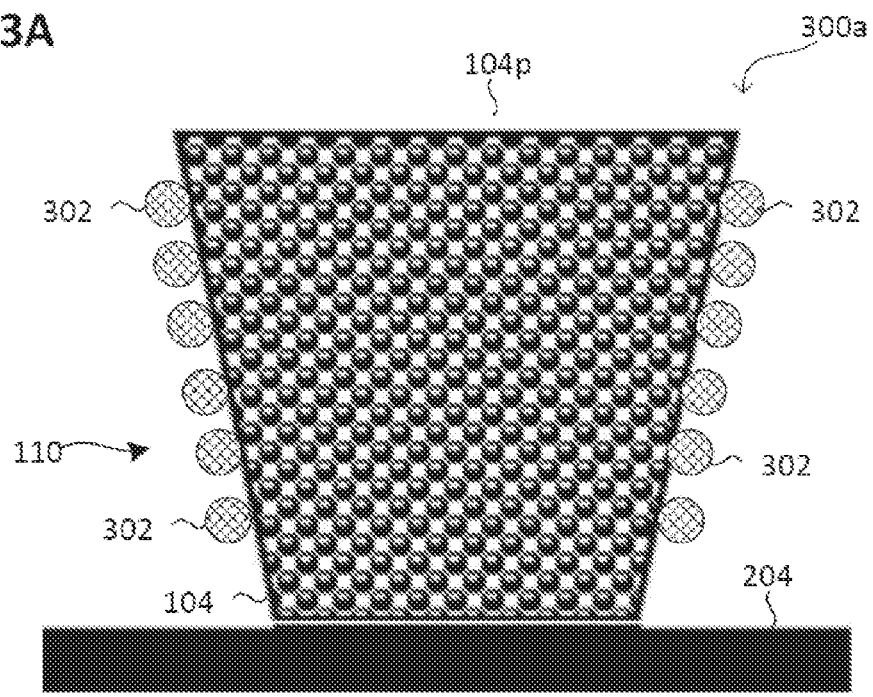
Figure 3B:
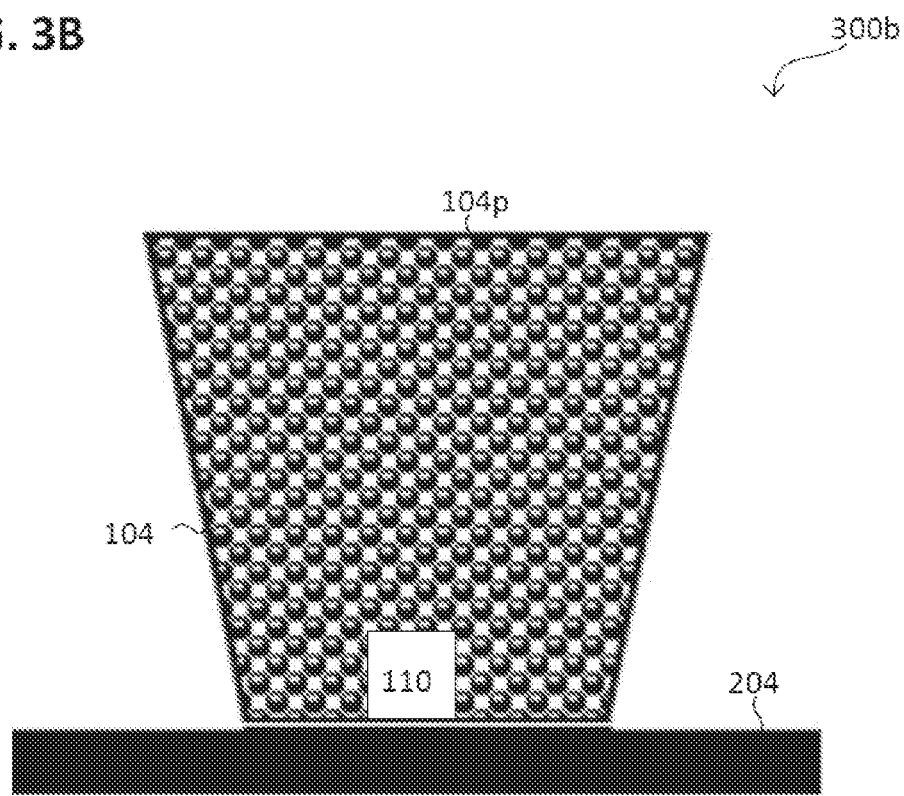

FIGS. 1A and 1B each show a solid particle source in accordance with various embodiments in a schematic side view or cross-sectional view;

FIGS. 2A and 2B each show a solid particle source in accordance with various embodiments in a schematic side view or cross-sectional view;

FIGS. 3A and 3B each show a solid particle source in accordance with various embodiments in a schematic side view or cross-sectional view;

FIG. 4 shows a diagram in accordance with various embodiments; and

FIGS. 5, 6, 7 and 8 each show a method in accordance with various embodiments in a schematic flow diagram.

In the following detailed description, reference is made to the accompanying drawings, which form part of this description and show for illustration purposes specific embodiments in which the invention may be implemented. In this regard, direction terminology such as, for instance, "at the top", "at the bottom", "at the front", "at the back", "front", "rear", etc. is used with respect to the orientation of the figure(s) described. Since components of embodiments may be positioned in a number of different orientations, the direction terminology serves for illustration and is not restrictive in any way whatsoever. It goes without saying that other embodiments may be used and structural or logical changes may be made, without departing from the scope of protection of the present invention. It goes without saying that the features of the various exemplary embodiments described herein may be combined with one another, unless specifically indicated otherwise. Therefore, the following detailed description should not be interpreted in a restrictive sense, and the scope of protection of the present invention is defined by the appended claims.

In the context of this description, the terms "connected", "attached" and "coupled" are used to describe both the direction and indirect connection (e.g. resistive and/or electrically conductive, e.g. an electrically conductive connection), a direct or indirect attachment and a direct or indirect coupling. In the figures, identical or similar elements are provided with identical reference signs, insofar as this is expedient.

In accordance with various embodiments, the term "coupled" or "coupling" may be understood in the sense of an (e.g. mechanical, hydrostatic, thermal and/or electrical), e.g. direct or indirect, connection and/or interaction. A plurality of elements may be coupled to one another for example along an interaction chain (e.g. the vibration source to the solid particles), wherein energy is transmitted for example along the interaction chain. In accordance with various embodiments, "coupled" may be understood in the sense of a mechanical (e.g. magnetic and/or physical) coupling, e.g. by means of a direct physical contact and/or by means of a magnetic interaction. A coupling may be configured, for example, to transmit a mechanical interaction (e.g. force, torque, etc.), e.g. by means of the magnetic interaction.

Vibration (e.g. oscillation) may be understood to mean a repeated temporal fluctuation of a state variable of a system, e.g. of a mechanical force, of a spatial location and/or of an electric and/or magnetic field (e.g. the field strength and/or field direction thereof). The vibration may take place for example as a deviation from a mean value.

Coupling in a vibration may be understood as excitation to carry out a vibration, e.g. by energy (also referred to as a vibrational energy) being transmitted. By way of example, the vibration of the vibration source may be coupled into the solid particles and excite them to carry out a mechanical vibration.

In accordance with various embodiments, an (e.g. high-frequency) vibratory crucible is provided as FPD and FPC component for the improved emission of particles by carrying out (e.g. multiaxial) vibrations or oscillations for the temporal and spatial separation of the contact points of adjacent solid particles (e.g. of a powder medium) in the vacuum.

In accordance with various embodiments, it has been recognized that a small average particle spacing (corresponds to a high densification) may lead to a reduction of the ohmic resistance in the particle supply (e.g. powder or bed), which is disadvantageous for the emission process during FPD or FPC. In accordance with various embodiments, an (e.g. high-frequency) vibration (e.g. in the kHz range) is coupled into a container (e.g. a vessel), e.g. in the form of a crucible, via mechanical contact with a piezo-crystal or else some other vibration source. At the surface of the particle supply, the vibration may bring about an increase in the average particle spacing (particulate separation or illustratively loosening) of the solid particles in the particle supply, i.e. a reduction of the particle density. By altering the parameters of the vibration, such as, for example, electrical voltage or frequency present at the vibration source, it is possible to vary the vibration of the vibration source (e.g. of the piezo-crystal) here in terms of frequency (e.g. in a range of approximately 10 kHz to approximately 100 kHz) and amplitude (less than 1 mm), such that the contact places of the particles experience a systematic influencing. Optionally, it is possible to effect an electrostatic decoupling between particle container, that is to say the application zone of the primary and secondary electrons, and surrounding components. Here, in the case of an insulated particle container, locally high voltages in the kV range (but e.g. less than the acceleration voltage of the electron beam source) may arise. Alternatively or additionally, the solid particles to be emitted (e.g. in the form of powder) may also be arranged onto a membrane (e.g. configured in an electrically conductive or electrically insulating fashion) that is to be caused actively to vibrate. In this case, an electrical decoupling between the membrane and the (e.g. inductive) vibration source may optionally be effected.

In accordance with various embodiments, a continuous, long-term-stable and/or material-independent emission of solid particles (also referred to as solid particle emission) is provided, e.g. for use in FPD and FPC methodology. This increases the economic viability of the solid particle emission.

In accordance with various embodiments, the region for receiving solid particles and/or the coating region may be arranged in a vacuum chamber. A vacuum chamber may be provided by means of a chamber housing in which one chamber or a plurality of chambers may be provided. The chamber housing, for example, for providing a reduced pressure or a vacuum (vacuum chamber housing), may be coupled (e.g. in a gas-conducting manner) to a pump arrangement, e.g. a vacuum pump arrangement, and be configured stably such that this withstands the action of air pressure in the evacuated state. The pump arrangement (including at least one vacuum pump, e.g. a high-vacuum pump, e.g. a turbomolecular pump) may make it possible to pump part of the gas out of the interior of the vacuum chamber, e.g. out of the region and/or the coating region. Accordingly, one vacuum chamber or a plurality of vacuum chambers may be provided in a chamber housing. In other words, the chamber housing may be configured as a vacuum chamber housing or a coating chamber may be configured as a vacuum chamber.

In accordance with various embodiments, a chamber housing, e.g. a vacuum chamber provided therein, may be configured in such a way that it is possible to provide therein a pressure in a range of approximately 10 mbar to approximately 1 mbar (in other words low vacuum), and/or a pressure in a range of approximately 1 mbar to approximately $10^{-3}$ mbar (in other words fine vacuum), and/or a pressure in a range of approximately $10^{-3}$ mbar to approximately $10^{-7}$ mbar (in other words high vacuum) and/or a pressure of less than high vacuum, e.g. less than approximately $10^{-7}$ mbar.

FIG. 1A and FIG. 1B each illustrate a solid particle source 100a, 100b in accordance with various embodiments in a schematic side view or cross-sectional view.

The solid particle source 100a, 100b may include a container 104 (also referred to as particle container 104) including a region 104b (also referred to as receiving region) configured for receiving solid particles 104p.

By way of example, the solid particles 104p may include or be formed from at least one material of the following materials: a metal; a transition metal, an oxide (e.g. a metal oxide or a transition metal oxide); a dielectric; a polymer (e.g. a carbon-based polymer or a silicon-based polymer); an oxynitride; a nitride; a carbide; a ceramic; a semimetal (e.g. carbon); a perovskite; a glass or vitreous material (e.g. a sulfidic glass); a semiconductor; a semiconductor oxide; a semiorganic material, and/or an organic material.

The solid particle source 100a, 100b may furthermore include at least one electron source 106 configured for introducing electrons into the region. The electron source 106 may be for example part of an electron beam gun configured to emit an electron beam 106s, e.g. into the solid particles and/or onto the container 104. The electrons introduced by means of the electron source 106 may bring about an electrostatic charging of the solid particles, which emits the latter in a direction 104e (also referred to as emission direction 104e) out of the container 104 (also referred to as solid particle emission), e.g. out of an opening of the container 104. The space into which the solid particle emission takes place may include a coating region 111 and/or, during operation of the solid particle source 100a, 100b, a vacuum. By way of example, a vacuum may be formed in the coating region 111 during operation of the solid particle source 100a, 100b.

In the emission direction 104e the container 104 may include the opening (also referred to as container opening).

The solid particle source 100a, 100b may optionally include a collecting device 108 for collecting the solid particles that are emitted 104e out of the region.

The solid particle source 100a, 100b may optionally include a material vapor source 114. The material vapor source 114 of the solid particle source 100a, 100b may be configured to vaporize 114e a coating material into the coating region 111 (also referred to as emitting 114e the material vapor). The material vapor source 114 may include for example a region 114b (e.g. provided by means of a crucible 114) in which the coating material 114p may be arranged. The vaporization may be effected for example by means of a or the electron beam 106s.

By way of example, the coating material 114p may include or be formed from at least one material of the following materials: a metal; a transition metal, an oxide (e.g. a metal oxide or a transition metal oxide); a dielectric; a polymer (e.g. a carbon-based polymer or a silicon-based polymer); an oxynitride; a nitride; a carbide; a ceramic; a semimetal (e.g. carbon); a perovskite; a glass or vitreous material (e.g. a sulfidic glass); a semiconductor; a semiconductor oxide; a semiorganic material, and/or an organic material.

The solid particle source 100a may be configured to coat a substrate with the solid particles 104p and with the coating material 114p. The coating formed on the substrate may include the solid particles 104p and the coating material 114p (e.g. a connector material).

In accordance with various embodiments, the substrate may include a plate, a film, a membrane, fibers, a braiding, a tangle and/or a fabric, which include or are formed from at least one of the following materials, for example: a ceramic, a glass, a semiconductor (e.g. amorphous, polycrystalline or monocrystalline semiconductor, such as silicon), a metal, and/or a polymer (e.g. plastic).

The solid particle source 100b may alternatively or additionally be configured to coat the solid particles 104p with the coating material 114p. The coating formed on the solid particles 104 may include the coating material 114p (e.g. a functional material). The coated solid particles 104p may subsequently be collected in a container and/or be transported into the latter (e.g. present as a loose bed therein). Optionally, a substrate may be coated with the coated solid particles 104p.

By way of example, the collecting device 108 of the solid particle source 100a, 100b may be configured for holding and/or transporting (e.g. along a transport path) a substrate, e.g. in the coating region 111. The material vapor source 114 may then be configured, for example, to emit the material vapor in the direction 114e of the substrate and/or of the transport path.

Alternatively, the collecting device 108 of the solid particle source 100b may include an additional container and be configured to collect solid particles by means of the additional container (also referred to as collecting container) and/or to transport them into the latter (e.g. by means of a transport device and/or out of the vacuum). In that case, the collecting device 108 may be arranged outside the coating region (e.g. behind the latter in the emission direction 104e) e.g. in a collecting region 113. The material vapor source 114 may be configured to emit 114*e* the material vapor past the collecting region 113, e.g. through between the collecting region 113 and the coating region 111.

Optionally, a substrate may be coated with the collected solid particles, e.g. by means of renewed solid particle emission (i.e. in the vacuum) or by means of liquid coating (e.g. admixed in a binder).

Furthermore, the solid particle source 100*a*, 100*b* may include a vibration source 110 configured to couple a vibration into the receiving region 114*b*. As an alternative or in addition to the vibration source 110, an organic material may be arranged in the region, which organic material spatially separates at least some of the solid particles from one another.

A spatial and/or electrostatic loosening of the solid particles may be effected by means of the vibration source 110 and/or the organic material. By way of example, the particle density (number of solid particles per volume) may be reduced by means of the vibration source 110 and/or the organic material.

The vibration source 110 may generally be operated electrically and implemented in various ways and/or effect coupling-in on the basis of various interactions. By way of example, a mechanical vibration may be coupled in, e.g. a repeatedly temporally fluctuating mechanical force. Alternatively or additionally, a vibrating electric and/or magnetic field may be coupled in.

Exemplary configurations of the vibration source 110 are described below.

FIG. 2A and FIG. 2B each illustrate a solid particle source 200*a*, 200*b* in accordance with various embodiments in a schematic side view or cross-sectional view.

The vibration source 110 of the solid particle source 200*a*, 200*b* may include or be formed from an electromechanical transducer 110*w* (e.g. including or formed from an electromechanical actuator). The electromechanical transducer 110*w* may for example couple the container 104 to a carrier 204 (e.g. in a manner arranged between them). The carrier 204 may have for example a greater inertia than the container 104. The carrier 204 may for example include or be formed from a baseplate and/or be part of a vacuum chamber.

Optionally, an electrical insulator 202 (e.g. a ceramic layer) may be arranged between the vibration source 110 and the container 104. By means of the insulator 202, the vibration source 110 may be galvanically isolated from the container 104, which reduces the influence of electrical charge introduced for the solid particle emission on the vibration source 110. Alternatively or additionally, the insulator 202 facilitates a conversion between a grounded container 104 and a container 104 mounted in an electrically floating fashion.

The electromechanical transducer 110*w* may be coupled to the container 104 by means of the electrical insulator 202, for example.

Optionally, the vibration source 110 may include a rod mechanism 110*g*, which transmits the mechanical vibration generated outside the container into or onto the container 104.

Optionally, the container 104, e.g. the container base thereof, may include a membrane coupled to the vibration source 110, e.g. the rod mechanism thereof. The membrane 104*m* (also referred to as vibratory membrane) may for example be configured in a spring-elastic fashion and/or be mounted in a spring-elastic fashion. By way of example, the membrane 104*m* may have a lower spring constant than a wall of the container 104 that adjoins the membrane 104*m* (also referred to as container wall).

Referring to FIG. 2A, the electromechanical transducer 110*w* of the solid particle source 200*a* may include a piezoelectric material, for example. The piezoelectric material may be arranged between two electrodes (first and second electrodes), for example, to which an electrical signal (e.g. an electrical oscillation) may be applied in order to excite the piezoelectric material. The piezoelectric material and the two electrodes may together be part of a piezoelectric actuator or form this.

The two electrodes may include electrical terminals and/or be connected to an electrical power source (e.g. an electrical vibration generator).

Optionally, the first electrode of the two electrodes may be provided by means of the carrier 204 and/or the second electrode of the two electrodes may be provided by means of the container 104 (e.g. if the latter or at least the container base is electrically conductive). This simplifies the solid particle source 200*a*. Alternatively, the electrical insulator 202 (e.g. a ceramic layer) may be arranged between the second electrode and the container 104.

Referring to FIG. 2B, the electromechanical transducer 110*w* of the solid particle source 200*b* may include a kinetic vibrator 110*v* (also referred to as a shaker), for example. The vibrator 110*v* may include for example an unbalance motor, a ball vibrator, a Lorentz force vibrator, an eccentric vibrator or the like.

The vibrator 110*v* may include a rod mechanism, for example, which is coupled to the container 104, e.g. by said rod mechanism being extended through the insulator 202. The rod mechanism may make it possible to couple the mechanical vibration into the container 104, e.g. the container base thereof.

The Lorentz force vibrator may include a coil and a permanent magnet, which generate a vibration by means of an electrical AC power. The coil (also referred to as plunger coil) may be arranged for example in a gap of the permanent magnet. Alternatively, the permanent magnet (also referred to as plunger magnet), e.g. a permanent-magnetic part of the rod mechanism 110*g*, may be arranged in the stationary coil. The plunger coil and/or the plunger magnet may for example enable, e.g. in a manner coupled to the membrane 104*m*, a compact design and/or separately controllable frequency and amplitude of the vibration.

The unbalance motor and/or the eccentric vibrator may enable a simplified electrical supply, e.g. with a DC power.

As an alternative or in addition to the electromechanical transducer, the vibration source 110 may include or be formed from a hydraulic or pneumatic transducer.

The solid particle source 200*a*, 200*b* may be configured to provide a physical coupling-in chain (also referred to as coupling-in interaction chain or transmission chain) from the vibration source 110 into the region 104*b* or the solid particles 104 arranged therein, i.e. a coupling-in chain consisting only of physical coupling-in links. The coupling-in chain may include for example at least the vibration source 110 and the container 104 and/or the solid particles 104.

However, the coupling-in chain need not necessarily be purely physical or include the container, as will be described below.

FIG. 3A and FIG. 3B each illustrate a solid particle source 300*a*, 300*b* in accordance with various embodiments in a schematic side view or cross-sectional view.

Referring to FIG. 3A, the vibration source 110 of the solid particle source 300*a* may include an alternating field source 302. In other words, the vibration source 110 of the solid particle source 300a may be configured to couple an electrical and/or magnetic vibration (generally electromagnetic vibration hereinafter) into the region 104, e.g. to couple an electromagnetic wave into the region 104, e.g. the solid particles 104p arranged therein.

The electrical vibration may be understood for example as a repeated temporal fluctuation of an electric field (e.g. the field strength and/or field direction thereof), as an alternating electric field. The magnetic vibration may be understood for example as a repeated temporal fluctuation of a magnetic field (e.g. the field strength and/or field direction thereof), e.g. as an alternating magnetic field. In other words, the coupling-in chain from the vibration source 110 to the solid particles 104 may include the electric and/or magnetic field. This makes it easier to couple in higher frequencies or to require less energy, since the mass of the container is not necessarily part of the coupling-in chain and therefore does not have to be excited to vibrate. By way of example, the container 104 may be nonmagnetic and/or electrically insulating.

By way of example, the vibration source 110 of the solid particle source 300a may include a coil 302, in which the container 104 is arranged. By way of example, an electric AC current may be coupled into the coil 302. The resultant alternating magnetic field may for example excite the solid particles 104p to effect a mechanical vibration, e.g. on account of the eddy current effect. In an analogous manner, alternatively or additionally, an alternating electric field may be generated, which excites the solid particles 104p to effect a mechanical vibration, e.g. on account of the dielectric displacement.

Referring to FIG. 3A, the vibration source 110 of the solid particle source 300b may also be at least partly (i.e. partly or completely) extended in the region 104b and/or arranged therein, for example the alternating field source 302 and/or the electromagnetic transducer 110w (e.g. at least the rod mechanism thereof). This may make it possible to transmit the vibration directly to the solid particles 104p. In other words, the coupling-in chain from the vibration source 110 to the solid particles 104 need not necessarily include the container 104. This makes it easier to couple in higher frequencies and/or to require less energy, since the mass of the container is not necessarily part of the coupling-in chain and therefore does not have to be excited to vibrate.

FIG. 4 illustrates a diagram 400 in accordance with various embodiments.

The diagram 400 illustrates the ohmic solid particle-to-solid particle resistance 401 (also referred to as resistance hereinafter) against the layer depth 403 in the container for solid particles which were exposed to different densification forces (increasing in the order 417, 415, 413, 411), thus resulting in different particle densities (increasing in the order 417, 415, 413, 411). The layer depth 403 having the value "0" denotes the topmost layer of the particle supply (at the opening of the container).

Such a densification of the solid particles is effected, for example, in order to increase the amount of solid particles received in the container, such that refilling has to be carried out less frequently. The densification force may be for example in a range of from approximately the weight force of the solid particles (in the case of particle density 417) to approximately 100 grams/square centimeter (in the case of particle density 411).

The solid particle-to-solid particle resistance 401 illustratively describes the electrical conductivity of a contact point of spatially adjacent solid particles (e.g. having a particle diameter in a range of approximately 1 µm to approximately 50 µm, e.g. in a range of approximately 5 µm to approximately 10 µm). The solid particle-to-solid particle resistance 401 may illustratively represent how strongly the solid particles are electrically conductively interlinked. The greater the solid particle-to-solid particle resistance 401, the lower may be the electrical conductivity of the particle supply and thus the ability to transport away the introduced electrons, which in turn increases the emission rate (e.g. amount and/or mass of emitted solid particles per time).

As illustrated in diagram 400, the resulting resistance 401 of the solid particles (e.g. a powder thereof) is dependent on the layer depth 403 and the applied densification force. Firstly, in accordance with various embodiments, it was recognized that the solid particle-to-solid particle resistance 401 decreases continuously with the layer depth 403 and, secondly, that a rising densification force brings about the same. In the case of sufficiently strong densifications, the dependence of the solid particle-to-solid particle resistance 401 on the layer depth 403 is scarcely still measurable.

In accordance with various embodiments, it was recognized that the cause of fluctuations of the emission rate is the dependence of the solid particle-to-solid particle resistance 401 on the layer depth and/or filling level. Illustratively, the solid particle-to-solid particle resistance 401 of the solid particles decreases proceeding from the container opening toward the container base, as a result of which the electrical potential may also be reduced more rapidly (which results in a temporally and spatially lower integration of charges) and as a result the electrostatic charging, that is to say the Coulomb repulsion, in turn decreases, which leads to a reduction of the emission rate.

On account of this correlation, the diagram 400 may also be read as the emission rate 401 against the elapsed time 403 during the solid particle emission.

This has the consequence that even the filling level of the container (at the beginning of the solid particle emission and/or in the course thereof) actually influences the resulting emission rate (also referred to as the degree of particle emission). The emission rate decreases with a lower filling level. In other words, a fluctuation in the filling level (e.g. on account of different preparation technicians) with which the solid particle emission is begun may lead to different emission rates. Alternatively or additionally, a decreasing filling level in the course of the solid particle emission may lead to a decreasing emission rate.

Furthermore, it was recognized that the type of the material of the solid particles (e.g. metal, semiconductor and/or insulator/ceramic) and also the geometric shape (in particular particle size)—that is to say in total the physical properties of the solid particles (e.g. in the powder)—also have a similar influence on the emission rate.

In accordance with various embodiments, the solid particles are loosened by means of the coupled-in vibration (by means of the excitation to effect mechanical vibration) by means of coupling 451 a vibration into the solid particles.

The consequence of the loosening is that the topmost layer of solid particles in the container, independently of the previous densification state 411, 413, 415, 417 thereof, is converted into a densification dependent on the coupled-in vibration, i.e. has a lower particle density 420 (particles per volume). Illustratively, the solid particles in the topmost layer are loosened, such that the emission rate thereof over time decreases less, e.g. remains substantially unchanged.

In the course of the consumption of solid particles (i.e. if the container is emptied) by means of the solid particle emission, subsequently the topmost layer of the current filling level is always loosened, such that even the lower layers of the particle supply are converted into a densification dependent on the coupled-in vibration.

Consequently, by way of example, it is also possible to accommodate more solid particles in the container 104, without having to accept a reduction of the emission rate.

Alternatively or additionally, the loosening may be effected by means of the organic material, as will be described in greater detail below.

FIG. 5 illustrates a method 500 in accordance with various embodiments in a schematic flow diagram.

The method 500 may include, in 501: generating a vacuum in a region in which solid particles are arranged.

The method 500 may furthermore include, in 503: introducing electrons into the solid particles in such a way that an electrostatic charging of the solid particles that is brought about by said electrons separates said solid particles from one another and accelerates them out of the region. Illustratively, the method 500 may include, in 503: emitting solid particles out of the region by electrons being introduced into the solid particles.

The method 500 may furthermore include, in 505: coupling a vibration into the solid particles arranged in the region (e.g. during the process of introducing the electrons into the solid particles). Illustratively, in 505, the solid particles may be excited to vibration (variation of the residence location).

The method 500 may optionally include: coating a substrate with the solid particles and/or coating the solid particles with a coating material.

The method 500 may optionally include: transporting the substrate in or through the vacuum.

The method 500 may optionally include: transporting and/or collecting the coated solid particles into an additional container.

FIG. 6 illustrates a method 600 in accordance with various embodiments in a schematic flow diagram.

The method 600 may include, in 601: generating a vacuum in a region in which solid particles are arranged, wherein an organic material (e.g. an organic connector material) is furthermore arranged in the region, which material spatially separates at least some of the solid particles from one another.

The method 600 may furthermore include, in 603: introducing electrons into the solid particles in such a way that an electrostatic charging of the solid particles that is brought about by said electrons separates said solid particles from one another and accelerates them out of the region.

By way of example, the solid particles may include and/or be formed from an inorganic material and additional solid particles including or formed from the organic material may be arranged in the region. In general, the chemical composition of the solid particles and of the additional solid particles may differ from one another. By way of example, the additional solid particles may include a greater proportion by mass of organic material than the solid particles.

The chemical composition may result for example from the material type of the solid particles. By way of example, the additional solid particles may include an organic material type and the solid particles may include at least one of the following (e.g. inorganic) material types: metallic, ceramic, semiconducting, glassy and/or mineral.

Alternatively or additionally, the solid particles may include an inorganic material and/or the organic material may at least partly envelop at least some of the solid particles. By way of example, the solid particles may be mixed and/or smeared with the organic material. By way of example, the organic material may be viscous.

The method 600 may optionally include: coating a substrate with the solid particles and/or coating the solid particles with a coating material.

The method 600 may optionally include: transporting the substrate in or through the vacuum.

The method 600 may optionally include: transporting and/or collecting the coated solid particles into an additional container.

Figure 7:
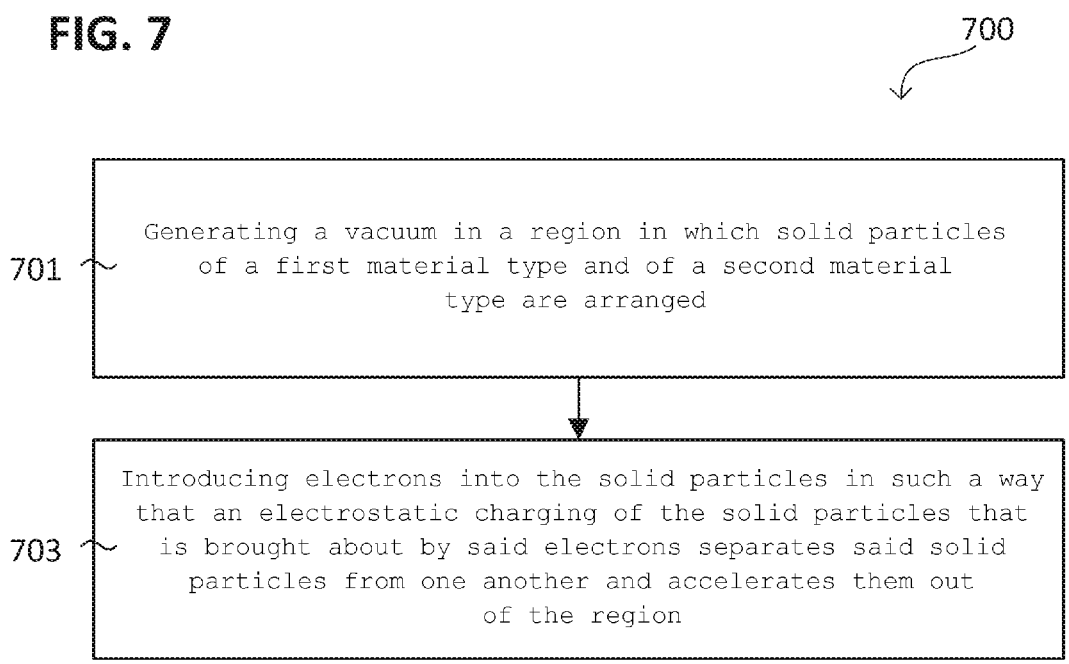

FIG. 7 illustrates a method 700 in accordance with various embodiments in a schematic flow diagram.

The method 700 may include, in 701: generating a vacuum in a region in which solid particles of a first (e.g. inorganic) material type and of a second (e.g. organic) material type are arranged. The solid particles of the first type may include a greater proportion by mass of organic material than the solid particles of the second type.

The method 700 may furthermore include, in 703: introducing electrons into the solid particles in such a way that an electrostatic charging of the solid particles that is brought about by said electrons separates said solid particles from one another and accelerates them out of the region. Illustratively, the method 700 may include, in 703: emitting solid particles out of the region by electrons being introduced into the solid particles.

The method 700 may optionally include: coating a substrate with the solid particles and/or coating the solid particles with a coating material.

The method 700 may optionally include: transporting the substrate in or through the vacuum.

The method 700 may optionally include: transporting and/or collecting the coated solid particles into an additional container.

Figure 8:
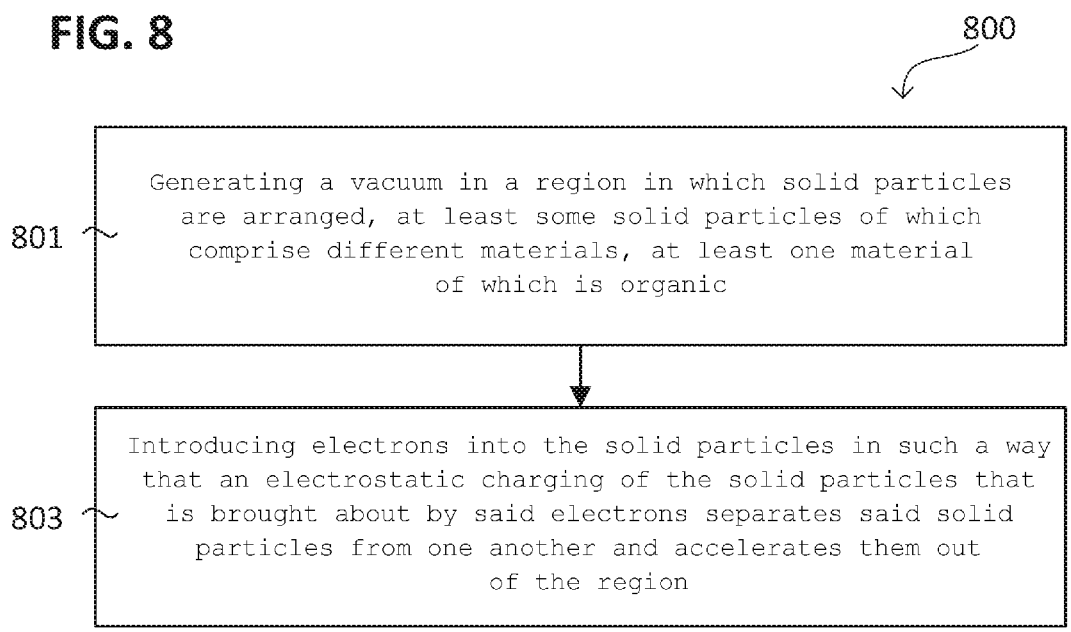

FIG. 8 illustrates a method 800 in accordance with various embodiments in a schematic flow diagram.

The method 800 may furthermore include, in 803: generating a vacuum in a region in which solid particles are arranged, at least some solid particles of which include different materials, at least one material of which is organic.

The method 800 may furthermore include, in 803: introducing electrons into the solid particles in such a way that an electrostatic charging of the solid particles that is brought about by said electrons separates said solid particles from one another and accelerates them out of the region. Illustratively, the method 800 may include, in 803: emitting solid particles out of the region by electrons being introduced into the solid particles.

By way of example, the solid particles may include a material composite (also referred to as composite solid particles) including an inorganic part (e.g. particulate core, e.g. the inorganic solid particles) and the organic material surrounding the latter. Alternatively or additionally, additional solid particles including or formed from the organic material may be mixed in. In general, the solid particles may include a plurality of portions which differ in their chemical composition. By way of example, the additional solid particles may include a greater proportion by mass of organic material than the solid particles.

The method 800 may optionally include: coating a substrate with the solid particles and/or coating the solid particles with a coating material.

The method 800 may optionally include: transporting the substrate in or through the vacuum.

The method 800 may optionally include: transporting and/or collecting the coated solid particles into an additional container.

The invention claimed is:

1. A solid particle source, comprising:
a container containing a region for receiving solid particles;
at least one electron source for introducing electrons into the solid particles in such a way that an electrostatic charging of the solid particles that is brought about by said electrons separates said solid particles from one another and accelerates them in a direction out of the container;
a vibration source configured to couple a vibration into the region in order to loosen the solid particles;
wherein the electron source comprises an emission surface for emitting electrons into a vacuum emission region.

2. The solid particle source as claimed in claim 1, wherein the vibration source comprises an electromechanical transducer.

3. The solid particle source as claimed in claim 1, wherein the vibration source comprises an electrical coil.

4. The solid particle source as claimed in claim 1, wherein the vibration source comprises a membrane adjoining the region.

5. The solid particle source as claimed in claim 1, wherein the vibration source is configured to transmit an electromagnetic vibration generated outside the region into the container.

6. The solid particle source as claimed in claim 1, wherein the vibration source is configured to transmit a mechanical vibration generated outside the region into the container and/or onto the container.

7. A treatment system, comprising:
the solid particle source of claim 1, and
a collecting device for collecting solid particles which are accelerated out of the region.

8. The treatment system as claimed in claim 7, wherein the collecting device comprises a substrate holder for holding a substrate to be coated with a substrate surface of the substrate in the direction of the region.

9. The treatment system as claimed in claim 7, wherein the collecting device comprises an additional container and is configured to collect solid particles by means of the additional container and/or to transport them into the latter.

10. The treatment system as claimed in claim 7, furthermore comprising:
a vacuum chamber, in which the region and/or the collecting device are/is arranged.

11. The treatment system as claimed in claim 7, furthermore comprising:
a coating region, which is arranged between the collecting device and the solid particle source or in which the collecting device is arranged;
a material vapor source configured to emit a material vapor into the coating region.

* * * * *